United States Patent
Patrick et al.

[11] Patent Number: 5,869,877
[45] Date of Patent: Feb. 9, 1999

[54] METHODS AND APPARATUS FOR DETECTING PATTERN DEPENDENT CHARGING ON A WORKPIECE IN A PLASMA PROCESSING SYSTEM

[75] Inventors: Roger Patrick, Mountain View; Phillip Jones, Fremont, both of Calif.

[73] Assignee: LAM Research Corporation, Fremont, Calif.

[21] Appl. No.: 842,193

[22] Filed: Apr. 23, 1997

[51] Int. Cl.$^6$ .......................... H01L 31/115; H01L 29/788
[52] U.S. Cl. ........................ 257/429; 257/48; 257/316; 257/317; 257/321; 257/379; 438/17; 438/18
[58] Field of Search .............................. 257/48, 315, 316, 257/317, 321, 379, 429; 438/17, 18

[56] References Cited

U.S. PATENT DOCUMENTS 5,315,145  5/1994  Lakaszek .

OTHER PUBLICATIONS

Lukaszek et al., Characterization of Wafer Charging Mechanisms and Oxide Survival Prediction Methodology, 1994 IEEE/IRIPS.

Fang et al., A Mechanism for Gate Oxide Damage in Nonuniform Plasmas, Center for Integrated Systems, Stanford University.
Hashimoto, Charge Damage Caused by Electron Shading Effect, LSI Wafer Process Division, Fujitsu Ltd., Part 1, No. 10, Oct. 1994.
Shideler et al., A New Technique for Solving Wafer Charging Problems., Semiconductor International, Jul. 1995.

*Primary Examiner*—Ngan V. Ngo
*Attorney, Agent, or Firm*—Lowe Hauptman; Gopstein Gilman & Berner

[57] ABSTRACT

A charge monitoring apparatus measures an electrical charge deposited on a multiple-layered workpiece, such as a semiconductor wafer, in a plasma processing system. The apparatus includes a charge collection electrode (CCE), a non-conducting patterned layer and a voltage or current sensor. The patterned layer is provided on the CCE and includes a plurality of openings that extend through the patterned layer to the conducting surface of the CCE. The openings create a topology having an adequate aspect ratio to cause electron shading to occur during plasma processing of the workpiece. The voltage or current sensor includes an EEPROM transistor that stores information regarding the amount of electrical charge that accumulates on the CCE during plasma processing.

29 Claims, 4 Drawing Sheets

Figure 6

METHODS AND APPARATUS FOR DETECTING PATTERN DEPENDENT CHARGING ON A WORKPIECE IN A PLASMA PROCESSING SYSTEM

TECHNICAL FIELD

The present invention relates to plasma processing systems and, more particularly, to methods and apparatus for detecting pattern dependent charging of workpieces in a plasma processing system.

BACKGROUND ART

It is known that certain manufacturing processes such as ion implantation, plasma etching, and other charged beam processes may cause damage to workpieces, such as semiconductor wafers, and the devices and circuits formed therein. In particular, electrical charging is a well known problem which can occur during the plasma processing of semiconductor devices leading to the degradation of the device performance. Electrical charging can, for example, be a problem when there are large antennas of conducting material such as metal or polysilicon attached to a transistor gate that utilizes a very thin (e.g., less than 100 angstroms) gate oxide. These antennas serve to collect a relatively high level of electrical charge by virtue of their large area. This electrical charge may then be funneled down onto a transistor (or other device) leading to performance degradation or outright destruction of the device.

In an effort to measure and/or characterize the charging that occurs during plasma processing, circuits have been developed to measure the resulting voltage potential (or a current flow) between a charge collection area on the surface of the semiconductor device wafer and the substrate of the semiconductor wafer. Circuits, such as these, are typically provided within the semiconductor wafer. For example, U.S. Pat. No. 5,315,145 describes a charge monitoring device using an EEPROM device that functions as a high impedance voltage sensor and/or current sensor with a memory capability.

By way of example, FIGS. 1a–1c are schematic cross-sectional views of three semiconductor wafers including different conventional charge monitoring devices. The semiconductor wafer includes a plurality of layers including a substrate 12 and an oxide layer 14. Each of the charge monitoring devices in FIGS. 1a, 1b and 1c includes an electrically programmable memory device having an Electrically Erasable Programmable Read Only Memory (EEPROM) transistor 16 for measuring and/or characterizing the charge that accumulates on a charge collection electrode (CCE) 18 (e.g., located on the surface of the wafer) during plasma processing.

A voltage sensor 10 is depicted in FIG. 1a. Voltage sensor 10 measures the positive potential between CCE 18 and substrate 12. Voltage sensor 10 includes EEPROM transistor 16 having a control electrode 20, a floating gate electrode 22, and source region 26 and drain regions 27. Control electrode 20 is connected to CCE 18. Floating electrode 22 located within oxide layer 14, includes a projection 24 that extends towards source region 26. Additionally, voltage sensor 10 includes a shunt diode 30 that is connected between CCE 18 and substrate 12. As depicted in FIG. 1a, diode 30 is connected to allow EEPROM transistor 16 to sense a positive potential between CCE 18 and substrate 12. If diode 30 is connected in the opposite direction between CCE 18 and substrate 12, as depicted by diode 30' in FIG. 1b, then voltage sensor 10' measures the negative potential between CCE 18 and substrate 12.

In other charge monitoring devices, diode 30 (or 30') are not required. However, the EEPROM transistor 16 in the resulting voltage sensor is affected by both positive and negative electrical charging during the process.

Furthermore, as depicted in FIG. 1c, wherein diode 30 (or 30') is replaced by a resistor 32, EEPROM transistor 16 in voltage sensor 10" measures the voltage drop across resistor 32 as a result of the electrical charge accumulated on CCE 18 and the charge flux between CCE 18 and substrate 12. Thus, voltage sensor 10" is essentially a charge flux sensor, or current sensor.

For a workpiece, such as a semiconductor wafer, several charge monitoring devices (e.g., those depicted in FIGS. 1a–c) are typically provided to monitor the wafer during fabrication and processing. To perform the desired measurements using these devices, a threshold voltage ($V_{t1}$) associated with EEPROM transistor 16 is programmed prior to exposing the wafer to a process, such as a plasma process. Programming is typically accomplished by probing the wafer and supplying a programming signal to EEPROM transistor 16 via CCE 18.

After the plasma process is completed, each EEPROM transistor 16 is again probed and a resulting threshold voltage ($V_{t2}$) is measured. The measurement $V_{t2}$ is typically accomplished by a parametric tester (not shown). This programming and measuring procedure is repeatable because each EEPROM transistor 16 is re-programmable.

Once $V_{t1}$ and $V_{t2}$ for a particular voltage sensor 10 are known, then the surface potential and charging is determined by using a calibration curve 35, as depicted in FIG. 2. Calibration curve 35 is a plot of threshold voltage $V_T$ versus a control gate voltage $V_G$ for an exemplary EEPROM transistor, where $V_T$ equals the difference in absolute magnitude between $V_{t1}$ and $V_{t2}$. Calibration curve 35 depicts the substantially linear relationship between $V_T$ and $V_G$.

If $V_{t2}$ is higher in absolute magnitude than $V_{t1}$, then the right-hand side 36 of calibration curve 35 is used to determine $V_G$ based on $V_T$. If $V_{t2}$ is lower in absolute magnitude than $V_{t1}$, then the left-hand side 38 of calibration curve 35 is used to determine $V_G$ based on $V_T$. In either situation, $V_G$ represents the potential between CCE 18 and substrate 12. Further, if voltage sensor 10 includes a known resistance, such as resistor 32 in FIG. 1c, between CCE 18 and substrate 12, then the current that flowed through the resistor during plasma processing can be determined by applying Ohm's law (e.g., the current equals $V_G$ divided by the known resistance).

Charge monitoring devices, such as the prior art voltage and current sensors depicted in FIGS. 1a–c, are able to detect global wafer charging caused by non-uniformities in the plasma. The non-uniformities, if significant enough, can lead to macroscopic level charging of the wafer. However, prior art charge monitoring devices are less effective in measuring charging occurring at the local microscopic level due to the topology of the fabricated device structure. Microscopic level charging can occur in a uniform plasma and is often dependent upon the pattern of the exposed surface of the wafer. For example, charging due to "electron shading", caused by the physical structure of the device is difficult to measure with the prior art charge monitoring devices.

SUMMARY OF THE INVENTION

Thus, there is a need for a method of and apparatus for detecting pattern dependent electrical charging in a workpiece, such as a semiconductor wafer. The method and apparatus of the present invention create measurable electron shading, such as, for example, on a charge collection electrode of a charge monitoring device.

In accordance with one aspect of the present invention the topology of an exposed surface of a charge collection electrode is altered so as to more closely resemble the topology of the other devices/areas on the workpiece that are being processed in the plasma processing system. As a result, the electric charge measured during workpiece plasma processing on the charge collection electrode, includes additional charges due to electron shading. This measurement is more representative of the actual electrical charging on the other devices/areas of the workpiece, especially compared to similar measurements made by the prior art charge monitoring devices.

In accordance with one embodiment of the present invention an apparatus for measuring an electric charge deposited on a multiple-layered workpiece, such as a semiconductor wafer, during processing in a plasma processing system is provided. The apparatus includes a charge collector, a non-conducting patterned layer and a sensor. The charge collector is formed within one or more of the layers of the workpiece. The charge collector has a conducting surface on the workpiece. The patterned layer, is located on the conducting surface of the charge collector. The patterned layer has plural openings that extend through the patterned layer to the conducting surface of the charge collector. The sensor, formed within one or more layers of the workpiece, is configured to sense electrical charge of the charge collector.

In accordance with other embodiments of the present invention, the patterned layer includes either a photoresist, a dielectric, a semiconductor, and/or an insulator material. Additionally, in accordance with certain embodiments, the openings in the patterned layer have an aspect ratio that causes a positive charge to accumulate on the conducting surface, during a workpiece plasma process, due at least in part to electron shading.

In other embodiments of the present invention the sensor includes an electrically programmable memory device that is electrically programmable through the charge collector. As such, the earlier stated needs are also met by embodiments of the present invention which include an electrically programmable memory device in a voltage sensor and/or a current sensor.

In accordance with yet another embodiment of the present invention, the apparatus includes at least two layers on the conducting surface of the charge collector, a contiguous layer and a non-conducting patterned layer which is on the contiguous layer Further, a method is provided in accordance with an embodiment of the present invention for detecting pattern dependent charging on a workpiece during manufacture of the workpiece in a plasma processing system. The method includes forming a sensor that has a conducting surface and an electrically programmable memory device, covering at least a portion of the conducting surface with a patterned layer, subjecting the workpiece to a plasma in the plasma processing system, and measuring an electrical charge of the conducting surface with the electrically programmable memory device.

The foregoing and other features, aspects and advantages of the present invention will become more apparent from the following detailed description of the present invention when taken in conjunction with the accompanying drawings.

BRIEF DESCRIPTION OF THE DRAWINGS

The present invention is illustrated by way of example, and not by way of limitation, in the figures of the accompanying drawings and in which like reference numerals refer to similar elements and in which:

FIG. 6 is a top view of an exemplary workpiece having a mixture of prior art charge monitoring devices and improved charge monitoring device as in FIGS. 4 and 5 in accordance with an embodiment of the present invention, with the voltage potentials as measured by each of the charge monitoring devices listed near to their location about the workpiece.

DETAILED DESCRIPTION OF THE EXEMPLARY EMBODIMENTS

While the present invention is described with reference to etching processes, the methods and apparatus of the present invention are adaptable to other plasma processes, including CVD type processes, sputtering processes, and ion implantation processes.

There are at least two different mechanisms responsible for electrical charging of semiconductor devices in a plasma processing system. The first charging mechanism is essentially a global wafer charging mechanism that occurs due to non-uniformities in the plasma. This type of charging mechanism was described, for example, in S. Fang and J. P. McVittie, *Proceedings of the International Reliability Physics Symposium*, p. 13 (1993). This effect leads to macroscopic charging of the wafer and is readily detected by charge monitoring devices such as those depicted in FIGS. 1a–c, and those used in conventional CHARM™ wafers which are available from Wafer Charging Monitors, Inc. of Woodside, Calif.

The second charging mechanism occurs in both uniform and non-uniform plasma and arises due to the charging of dielectric patterns, such as, for example, a photoresist layer, on the surface of the wafer. This effect occurs on a local microscopic level. This second mechanism has been referred to as "electron shading" and arises because of the difference in directionality of ions and electrons as they cross the plasma sheath to the wafer. This mechanism has been described by Hashimoto, *Jap. J. Appl. Phys.* 33 (part 1, no. 10), p. 6013 (1994).

Figure 3:
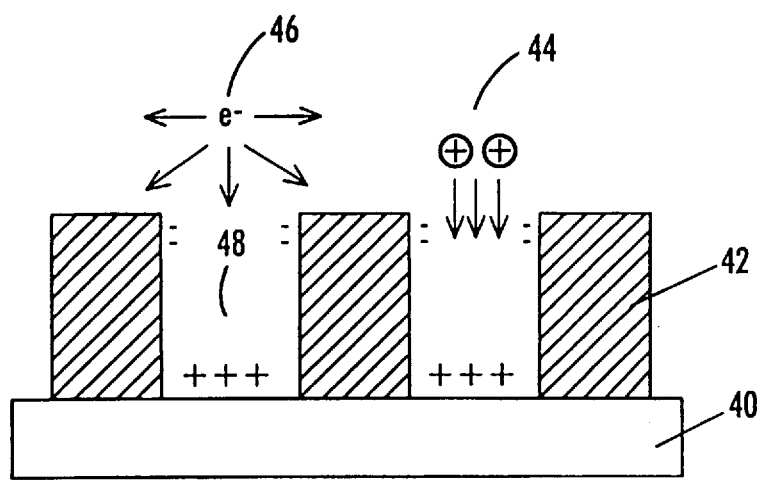
FIG. 3 is a cross-sectional view of a semiconductor wafer schematically depicting electron shading caused by a patterned photoresist layer.

FIG. 3 schematically depicts electron shading on a semiconductor device. In FIG. 3, a top layer 40 of a device is shown formed over other device layers or over a substrate (not shown). A patterned photoresist layer 42 is provided on top layer 40. During processing of the device, patterned photoresist layer 42 and top layer 40 are subjected to a plasma (that includes positively charged ions 44 and negatively charged electrons 46) which contacts patterned layer 42 and top layer 40 and results in a charge being deposited on either (or both) of patterned layer 42 and/or top layer 40.

In order for charging to occur at the wafer surface (i.e., patterned layer 42 and/or top layer 40 FIG. 3), the positive and negative charges must be become separated from one another. The charges are be separated by a structure, such as that shown in FIG. 3, with a relatively high aspect ratio (i.e., the ratio of the width of opening 48 to the depth of opening 48). When a structure with a high aspect ratio is subjected to a plasma in a plasma processing system, positively charged ions are accelerated (e.g., as a result of a dc bias at the wafer), towards the wafer surface in a fairly directional manner as depicted by the arrows below ions 44. Electrons 46, however, are less affected by the dc bias and as such move in a more isotropic manner as depicted by the arrows around electrons 46. This results in an accumulation of positive charge at the bottom of opening 48 because, on average, positively charged ions 44 are more likely to penetrate to the bottom of opening 48 than are electrons 46. Thus, any structure with a high enough aspect ratio tends to charge more negatively at the top and more positively at the bottom. Hence, the term "electron shading" which describes the situation wherein the bottom of opening 48 is essentially shaded from electrons 46. This kind of charging mechanism is not readily detected by conventional charge monitoring devices such as those in the CHARM™ wafer, or in the prior art arrangements of FIG. 1a–c.

With this in mind, the methods and apparatus of the present invention are directed to creating electron shading on the charge collection electrode of a charge monitor, similar to the electron shading found on the other devices on the workpiece that are being fabricated via the plasma processing system.

In accordance with one embodiment of the present invention, a modification is made to a CHARM™ wafer device (or similar charge monitoring device) to detect the additional electrical charging due to electron shading. The modification includes placing an appropriately patterned photoresist layer, or other type of non-conducting material layer, over CCE 18.

In other exemplary embodiments, the modification includes first placing a dielectric layer over CCE 18 and then placing an appropriately patterned photoresist layer, or other type of non-conducting material layer, over the dielectric layer. The dielectric layer being is selected to match or otherwise approximate the types of material(s) affected by the plasma process. For example, a layer of silicon dioxide can be used to monitor a conductor (e.g., metal and/or polysilicon) etch plasma process, or a dielectric layer can be used to monitor a dielectric(e.g., contact and/or via) etch application.

The patterned photoresist layer, in the exemplary embodiments, forms openings that provide an appropriate aspect ratio to cause electron shading or to match other topologies of the workpiece. For example, a patterned photoresist can comprise arrays of narrowly spaced, narrow lines, or small holes, depending upon the process and the topology of the device/structure that is being monitored and/or fabricated.

Figure 1A:
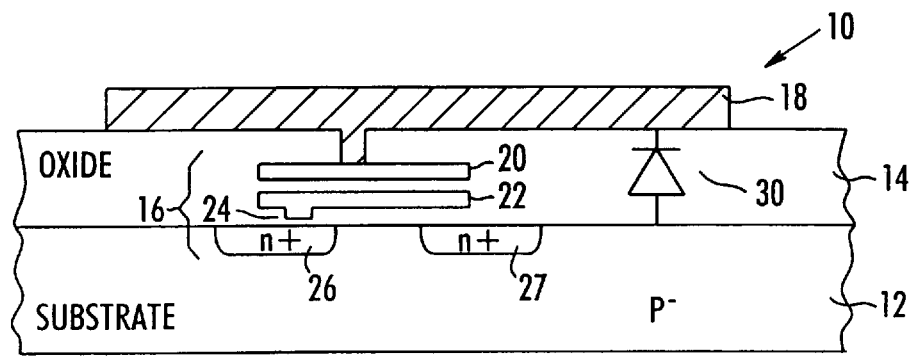
FIGS. 1a–c are cross-sectional views of a semiconductor wafer schematically depicting three different conventional charge monitoring devices having EEPROM transistors.
Figure 1B:
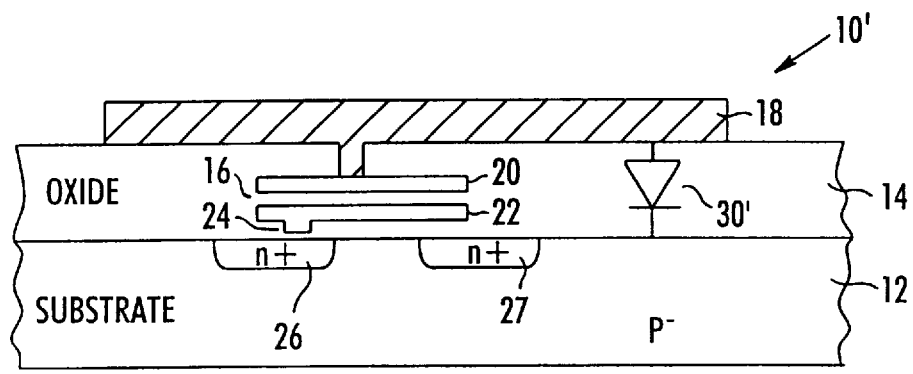
Figure 1C:
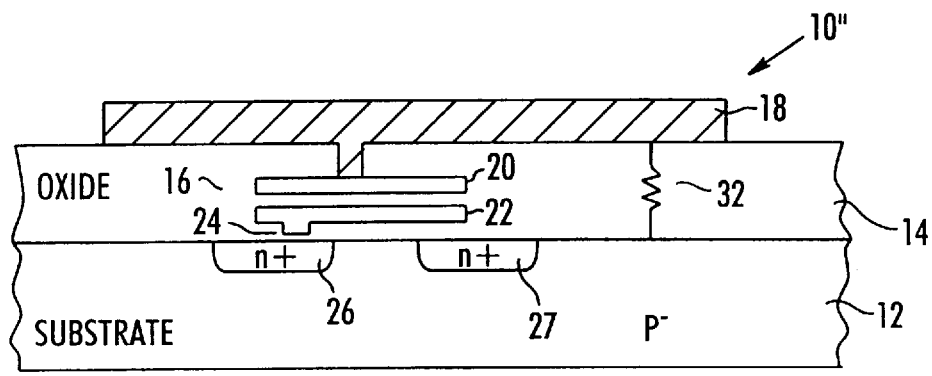
Figure 2:
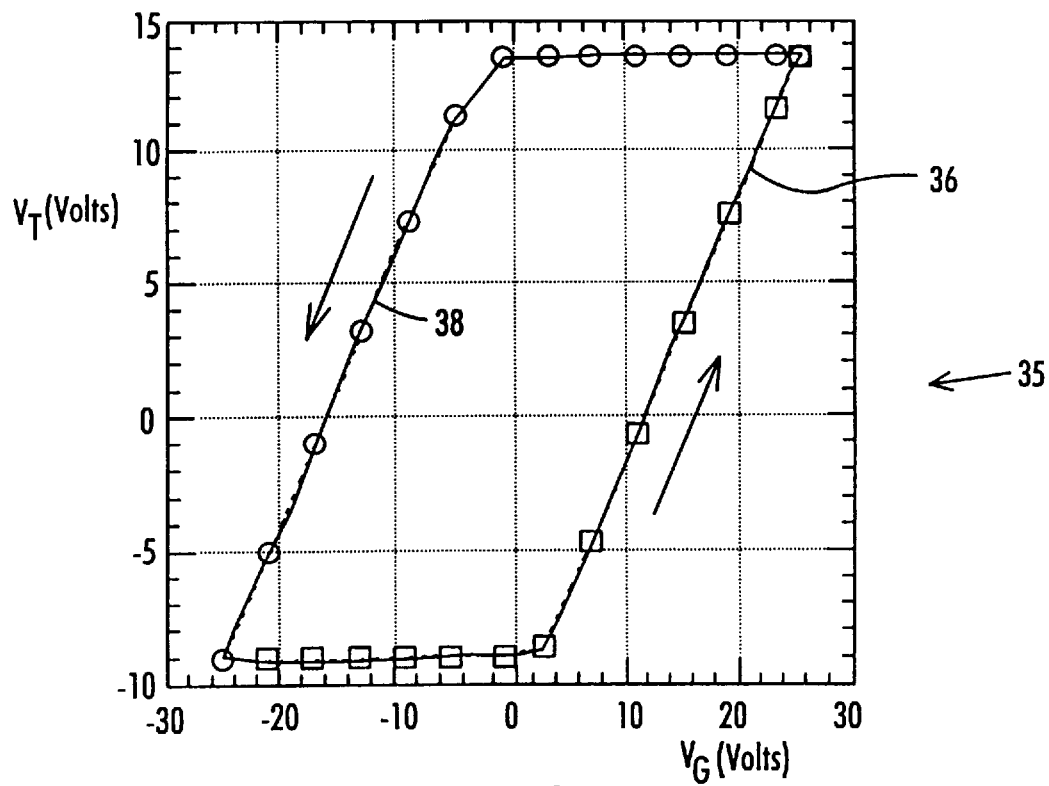
FIG. 2 is a graph of the threshold voltage versus the control gate voltage of an EEPROM transistor, as in FIGS. 1a–c.
Figure 4:
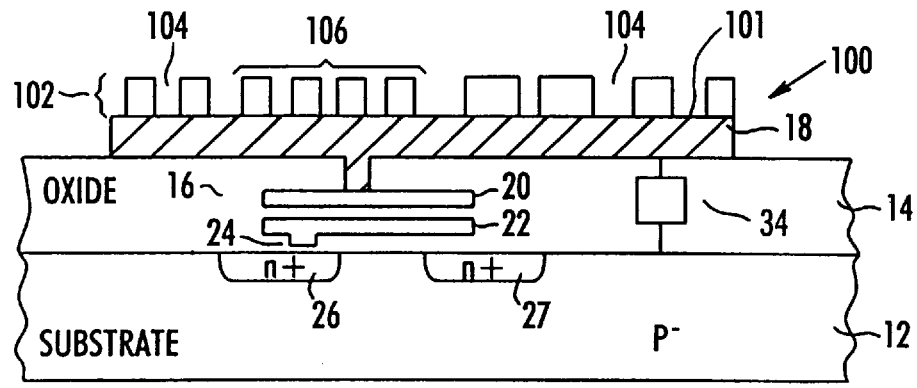
FIG. 4 is a cross-sectional view of a workpiece schematically depicting an improved charge monitoring device having an EEPROM transistor, in accordance with a first embodiment of the present invention.

FIG. 4 is a cross sectional view of an improved charge monitoring device 100. Charge monitoring device 100 has many of the same design features as the devices of FIGS. 1a–c and like elements have the same reference numerals. However, charge monitoring device 100 is configurable as either a positive or negative voltage sensor (as depicted in FIGS. 1a and 1b, respectively) if element 34 is a properly connected diode (i.e., diode 30, or 30'). Charge monitoring device 100 is also configurable as a current sensor (as depicted in FIG. 1c) if element 34 is a properly connected resistor (i.e., resistor 32).

As depicted in FIG. 4, a non-contiguous patterned layer 102 is provided on an exposed surface 101 of CCE 18. Patterned layer 102 covers at least a portion of the exposed surface 101 and includes openings 104 that extend through patterned layer 102 to the exposed surface 101 of CCE 18. Patterned layer 102 includes at least one of a photoresist material, a dielectric material, a semiconductor material, and/or an insulator material. In certain exemplary embodiments, patterned layer 102 includes either a uniform or non-uniform array of lines 106 that are spaced apart so as to leave openings 104 in the space between the lines. In other embodiments, patterned layer 104 resembles the type of pattern applied to other devices/areas being fabricated in the plasma processing system.

As shown, each of the openings 104 includes an inherent aspect ratio, which is the ratio of the width of the opening to the depth of the opening. Preferably, the aspect ratio is high enough to cause a positive charge to build up on CCE 18 during a plasma process due at least in part to the electron shading mechanism described above. As a result, charge monitoring device 100 measures the additional electrical charging due to electron shading. Thus, unlike the prior art charge monitoring devices in FIGS. 1a–c, charge monitoring device 100 more accurately measures the charging as deposited on the other devices/areas that are being fabricated by providing a topology that more closely resembles the exposed topology of the devices/areas. One of the advantages of this improved charge measuring capability is improved control over the plasma process which tends to lead to a reduction in the damage to the wafer devices and lower manufacturing costs.

Figure 5:
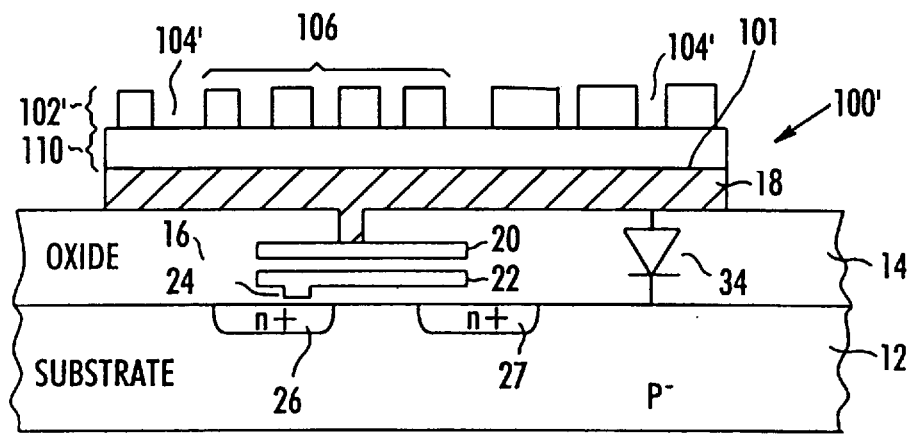
FIG. 5 is a cross-sectional view of a workpiece schematically depicting an improved charge monitoring device having an EEPROM transistor, in accordance with a second embodiment of the present invention.

FIG. 5 depicts another embodiment of an improved charge monitoring device 100'. Charge monitoring device 100' has all of the same design features as the charge monitoring device 100 of FIGS. 4, and like elements have the same reference numerals. Charge monitoring device 100' is configurable as either a positive or negative voltage sensor (as depicted in FIGS. 1a and 1b, respectively) if element 34 is a properly connected diode (i.e., diode 30, or 30'). Charge monitoring device 100' is also configurable as a current sensor (as depicted in FIG. 1c) if element 34 is a properly connected resistor (i.e., resistor 32).

In charge monitoring device 100', a dielectric layer 100 is provided on CCE 18. Dielectric layer 110 is contiguous across exposed surface 101 of CCE 18. On top of dielectric layer 110 is a patterned layer 102', similar to that shown in FIG. 4 above. Patterned layer 102' is non-contiguous across dielectric layer 110 and includes openings 104'. Openings 104' extend through patterned layer 102' to reveal sections of dielectric layer 110 located above CCE 18.

Charge monitoring device 100', for example, is useful in monitoring or characterizing the charging that occurs during a plasma etching process wherein the topology of the wafer is altered during the process. For example, when a wafer containing a charge monitoring device 100' is subjected to an etching plasma, the molecules and atoms in the plasma etch through dielectric layer 102' via openings 104' to reveal the exposed surface 101 of CCE 18, assuming that conventional etching processing is properly performed. This etching changes the aspect ratio of openings 104' because the depth of openings 104' increases as material from dielectric layer 110 is etched away. Thus, in this situation charge monitoring device 100' provides a more accurate measure of the charging occurring on the actual wafer devices/areas that are also being etched away during the plasma etching process.

The embodiment of FIG. 4 is useful in replicating the charging occurring elsewhere on the semiconductor wafer when, for example, an etching process is used to create contact holes, and/or vias. For example, if dielectric layer 110 is an oxide which is to be etched, a $CF_4$ process can be used to etch through dielectric layer 110 to CCE 18 during a contact or via etch process. Additionally, the etching process could also etch a portion of CCE 18, providing that a sufficient portion of CCE 18 remains so as to be probed at a later stage in the manufacturing process.

Therefore, with the improvements provided by the various embodiments of the present invention, charge monitoring devices such as those in a CHARM™ wafer, more effectively measure the electrical charges that accumulate on other devices/areas within the wafer during a plasma process. One method to create such charge monitoring devices (e.g., charge monitoring device 100) in a wafer for example, according to one embodiment of the present invention, includes producing a charge monitoring device 10 (or 10', 10") having a CCE 18 and programming the EEPROM 16 (i.e., setting threshold voltage $V_{t1}$) in charge monitoring device 10 in accordance with known principles, structures and methods. A photoresist layer is applied to the wafer such that an exposed surface 101 of CCE 18 is covered. The photoresist layer is then exposed with an appropriately configured mask and the exposed photoresist material is then developed out, thereby creating charge monitoring device 100 having a patterned layer 102 on exposed surface 101. Once this is done, the wafer (and patterned layer 102) is exposed to a plasma process within a plasma processing system. Following completion of the plasma process, patterned layer 102 is stripped off, for example with a conventional wet process. Once patterned layer 102 has been stripped off, EEPROM transistor 16 is probed and threshold voltage (i.e., $V_{t2}$) is measured.

Furthermore, in accordance with certain embodiments of the present invention, the method further includes providing a dielectric layer 110 between CCE 18 and a patterned layer 102' to create a charge monitoring device 100'.

In another embodiment of the present invention, a method of detecting pattern dependent charging on a semiconductor wafer during manufacture and/or fabrication of a wafer in a plasma processing system is provided. The method includes providing a sensor (e.g., a charge monitor device 10 or 10', 10") in the semiconductor wafer, the sensor having a conducting surface (e.g., a CCE 18), coupled to an electrically programmable memory device (e.g., EEPROM 16). The method includes covering at least a portion of the conducting surface with a patterned layer (e.g., patterned layer 102, or 110 and 102'), subjecting the wafer, including at least a portion of the conducting surface and the patterned layer to a plasma process in a plasma processing system. The method further includes measuring an accumulation of electrical charge on the exposed portion of the conducting surface and patterned layer with the electrically programmable memory device.

Figure 6:
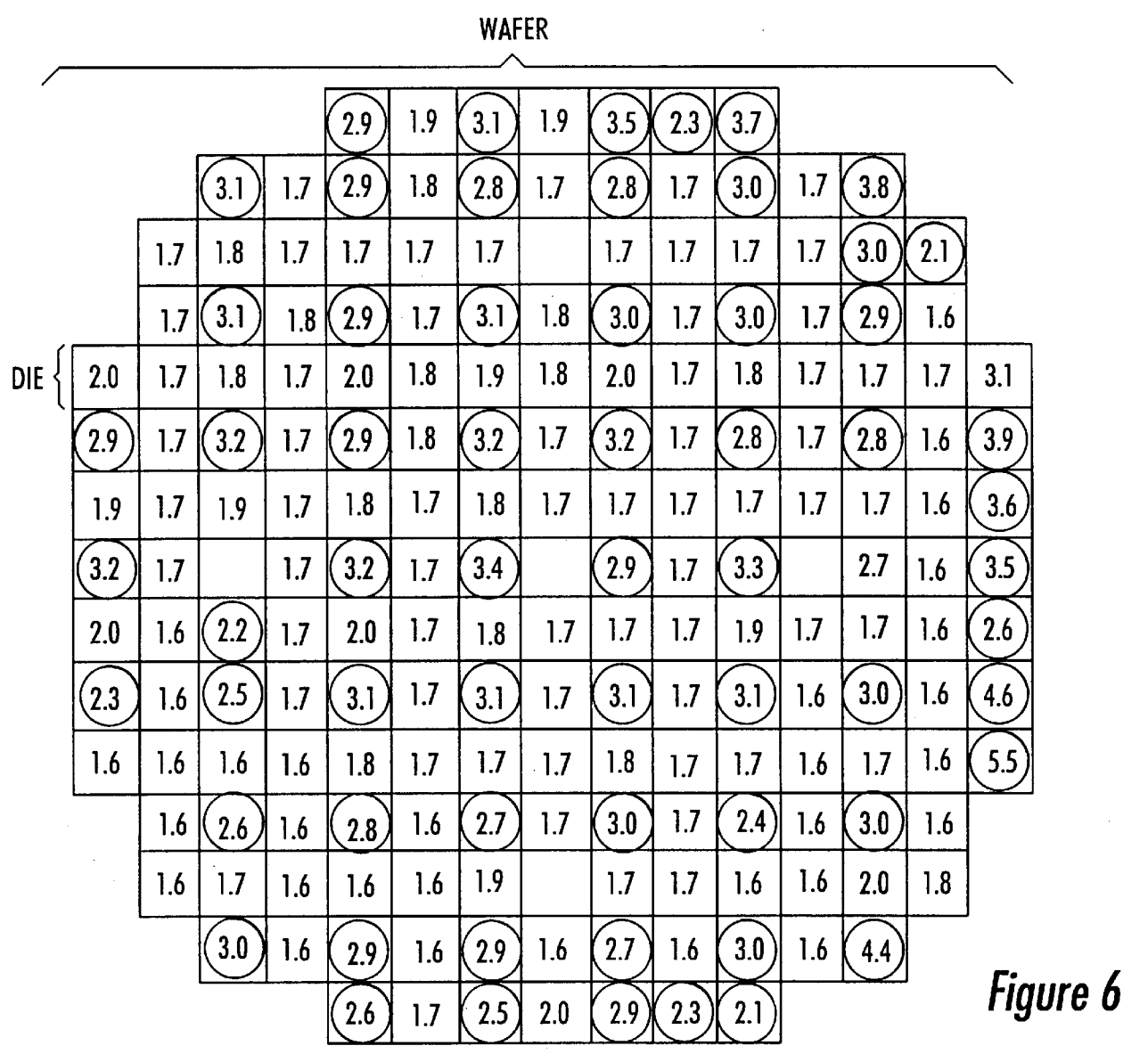

FIG. 6 is an illustration of the experimental results of processing a CHARM™ wafer in accordance with the above methods and apparatus in a LAM TCP 9600 SE high density metal etch system, which is available from LAM Research Corporation of Fremont, Calif. FIG. 6 is an illustration of the layout of the semiconductor wafer and a plot of data collected for an exemplary wafer which includes a plurality of dies each having a charge monitoring device. The layout of the wafer was such that about 25% of the charge monitoring devices had a patterned photoresist layer (of one-micron lines and spaces arranged in a checkerboard pattern) on their CCEs, the remaining charge monitoring devices had their CCEs completely covered with a non-patterned photoresist layer. The photoresist thickness was approximately 1.1 microns. The wafer was exposed to a non-etching argon plasma using approximately 400 watts TCP power at a pressure of about 20 mT and 100 sccm flow (with no wafer bias power applied) for approximately 60 seconds.

As illustrated, the circled data represent the control gate voltages ($V_G$) measured by the voltage sensors having the patterned photoresist layer on their CCEs, according to an embodiment of the present invention. The non-circled data represents the control gate voltages ($V_G$) measured by the voltage sensors having the non-patterned photoresist layer on their CCEs. It can be seen that the $V_G$ of the non-patterned photoresist covered sensors is about 1.7 volts, while the $V_G$ of the patterned photoresist covered sensors is higher, approximately 3.0 to 4.0 volts. Thus, the effects of electron shading of the charge collection electrode are apparent as measured by the differences in the measured $V_G$.

Furthermore, experimental results have shown that pattern dependent charging is increased by application of a dc bias to the wafer during plasma processing. It is also recognized that for higher aspect ratios and/or smaller topologies that the electron shading mechanism will tend to increase the amount of electrical charge that accumulates on the workpiece.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An apparatus for detecting pattern dependent charging on a workpiece in a plasma processing system, the apparatus comprising:

a charge collector formed on one or more layers of the workpiece, the charge collector having a conducting surface on the workpiece;

a patterned layer on the conducting surface of the charge collector, the patterned layer having a plurality of openings that extend through the patterned layer to the conducting surface of the charge collector; and a sensor for an electrical charge on the charge collector, the sensor being formed on one or more layers of the workpiece.

2. The apparatus as recited in claim 1 wherein the patterned layer includes at least one material selected from the group comprising a photoresist, a dielectric, a semiconductor, and an insulator material.

3. The apparatus as recited in claim 1 wherein at least one of the plurality of openings has an aspect ratio that causes a positive charge to accumulate on the conducting surface during a plasma process due at least in part to electron shading.

4. The apparatus as recited in claim 3 wherein the sensor further comprises a readout device on one or more layers of the workpiece, the programmable readout device being coupled to the charge collector and an underlying layer of the workpiece.

5. The apparatus as recited in claim 4 wherein the sensor is a voltage sensor that further comprises a diode on one or more layers of the workpiece, the diode being coupled between the charge collector and the underlying layer, the programmable readout device being configured to measure an electrical potential between the charge collector and the underlying layer.

6. The apparatus as recited in claim 4 wherein the sensor is a current sensor that further comprises a resistor on one or more layers of the workpiece, the resistor being coupled between the charge collector and the underlying layer of the workpiece, the programmable readout device being configured to measure a voltage across the resistor.

7. An apparatus for detecting pattern dependent charging on a workpiece in a plasma processing system, the apparatus comprising:
    a charge collector formed on one or more layers of the workpiece, the charge collector having a conducting surface positioned on a top layer of the semiconductor wafer;
    a contiguous layer on the conducting surface of the charge collector;
    a patterned layer on the contiguous layer, the patterned layer having a plurality of openings that extend through the patterned layer to the contiguous layer; and
    a sensor for an electrical charge on the charge collector, the sensor being formed on one or more layers of the workpiece, the sensor configured to sense an electrical charge of the charge collector.

8. The apparatus as recited in claim 7 wherein the contiguous layer includes at least one material selected from the group comprising a dielectric, a semiconductor, and an insulator material.

9. The apparatus as recited in claim 8 wherein the patterned layer includes at least one material selected from the group comprising a photoresist, a dielectric, a semiconductor, and an insulator material.

10. The apparatus as recited in claim 9 wherein at least one of the plurality of openings conducting electrode has an aspect ratio that causes a positive charge to accumulate on the conducting electrode during a plasma process due at least in part to electron shading.

11. The apparatus as recited in claim 10 wherein the sensor further comprises a programmable readout device on one or more layers of the workpiece, the programmable readout device being coupled to the charge collector and an underlying layer in the workpiece.

12. The apparatus as recited in claim 11 wherein the sensor is a voltage sensor that further comprises a diode within one or more layers of the workpiece, the diode being coupled between the charge collector and the underlying layer of the workpiece, the programmable readout device being configured to measure an electrical potential between the charge collector and the underlying layer in the workpiece.

13. The apparatus as recited in claim 11 wherein the sensor is a current sensor that further comprises a resistor within one or more layers of the workpiece, the resistor being coupled between the charge collector and the underlying layer of the workpiece, the programmable readout device being configured to measure a voltage across the resistor.

14. The apparatus of claim 3 wherein the readout device comprises an electrically programmable memory configured to be electrically programmed via the charge collector.

15. The apparatus of claim 10 wherein the readout device comprises an electrically programmable memory configured to be electrically programmed via the charge collector.

16. Apparatus for detecting pattern dependent charging on a workpiece during manufacture of the workpiece in a plasma processing system, the apparatus comprising a sensor on the workpiece, the sensor including a charge collecting conducting surface, a structure for charge shading at least a portion of the conducting surface from the plasma, the charge shading being arranged to cause (a) charge carriers of only one polarity in the plasma to charge different spaced areas on the conducting surface and (b) other areas on the conducting surface, between the different spaced areas, not to be substantially charged by charge carriers of the plasma, the sensor being arranged to measure electric charge accumulated by the conducting surface in response to the charging resulting from the plasma charging the conducting surface via the charge shading structure.

17. The apparatus of claim 16 wherein the sensor includes a readout device on one or more layers of the workpiece, the readout device being coupled between the conducting surface and an underlying layer in the workpiece and configured to be readout via the conducting surface.

18. The apparatus of claim 17 wherein the readout device is an electrically programmable memory.

19. The apparatus of claim 16 wherein the structure includes a patterned layer including apertures enabling the charge carriers of only one polarity to charge the collecting conducting surface and solid regions between the apertures.

20. The apparatus of claim 19 wherein the patterned layer contacts the conducting surface.

21. The apparatus of claim 19 further including a contiguous charge transfer layer interposed between the patterned layer and the conducting surface.

22. A method of detecting pattern dependent charging on a workpiece during manufacture of the workpiece in a plasma processing system, the workpiece including a sensor having a charge collecting conducting surface,
    the method comprising:
        charge shading at least a portion of the conducting surface while the workpiece is subject to the plasma of the plasma processing system;
        the shading causing (a) charge carriers of only one polarity in the plasma to charge different spaced areas on the conducting surface and (b) other areas on the conducting surface between the different spaced areas not to be substantially charged by charge carriers of the plasma, and
        measuring electric charge accumulated by the conducting surface in response to the charging resulting from the shading.

23. The method of claim 22 wherein the shading is performed by interposing an apertured layer between the conducting surface and the plasma.

24. The method as recited in claim 22 wherein the step of shading at least a portion of the conducting surface comprises placing a noncontiguous patterned layer on the charge collection electrode.

25. The method as recited in claim 22 wherein the step of shading at least a portion of the conducting surface comprises placing a contiguous first layer on a charge collection electrode and a noncontiguous second layer on at least a portion of the contiguous first layer.

26. The method as recited in claim 22 wherein the step of measuring the electric charge on the conducting surface further comprises measuring an electrical potential between the conducting surface and an underlying layer of the workpiece with a programmable readout device.

27. The method as recited in claim 26 wherein:

the sensor comprises a linear impedance element between the conducting surface and the underlying layer; and the step of measuring the electric charge on the conducting surface further comprises measuring a voltage drop across the linear impedance with the programmable readout device.

28. The method as recited in claim 26 wherein the step of measuring the electric charge on the conducting surface further comprises measuring a threshold voltage level of the programmable readout device.

29. The method of claim 24 wherein the patterned layer material is selected from the group comprising a photoresist, a dielectric, semiconductor, and an insulator.

* * * * *